United States Patent [19]

Espaignol et al.

[11] 4,102,037
[45] Jul. 25, 1978

[54] METHOD OF CREATING A MILLIMETER WAVE SOURCE AND OF ADAPTING SUCH A SOURCE TO WAVEGUIDE TRANSMISSION

[75] Inventors: Jacques Espaignol; Edmond Klein, both of Paris, France

[73] Assignee: Thomson-CSF, Paris, France

[21] Appl. No.: 787,058

[22] Filed: Apr. 13, 1977

[30] Foreign Application Priority Data

Apr. 16, 1976 [FR] France .................. 76 11442

[51] Int. Cl.² .......................... B01J 17/00
[52] U.S. Cl. ........................ 29/583; 29/580; 29/590; 29/591
[58] Field of Search ............ 29/580, 583, 590, 591

[56] References Cited

U.S. PATENT DOCUMENTS

| 3,689,357 | 9/1972 | Jordan | 29/583 |
| 3,795,045 | 3/1974 | Dumas | 29/583 |
| 3,913,215 | 10/1975 | Heckl | 29/580 |
| 4,048,712 | 9/1977 | Buiatti | 29/580 |

Primary Examiner—W. Tupman
Attorney, Agent, or Firm—Oblon, Fisher, Spivak, McClelland & Maier

[57] ABSTRACT

A unitary device comprising a millimeter wave source embedded in a block which integrated simultaneously the bias means, the heat-dissipation means and the impedance-matching arrangements. The source, which is an avalanche diode of very small dimensions, is welded to a dissipating mounting comprising a central platform with a slight central projection. Subsequently, the diode is surrounded by a glass ring whose central opening is filled with polymerizable resin. Mechanical grinding is carried out in order to bare the top layer of the diode and metallizing performed in order to provide a supply terminal for DC. In an application of the invention to a millimeter waveguide, the supply contact is formed by a simple transverse metal wire leaving the walls of the waveguide through insulating lead-throughs.

5 Claims, 6 Drawing Figures

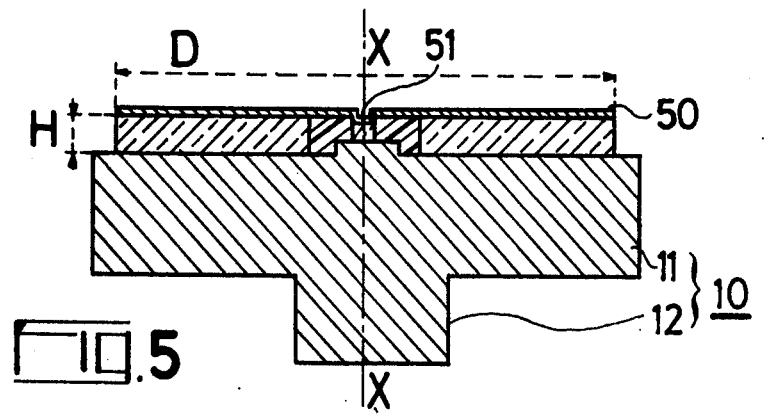
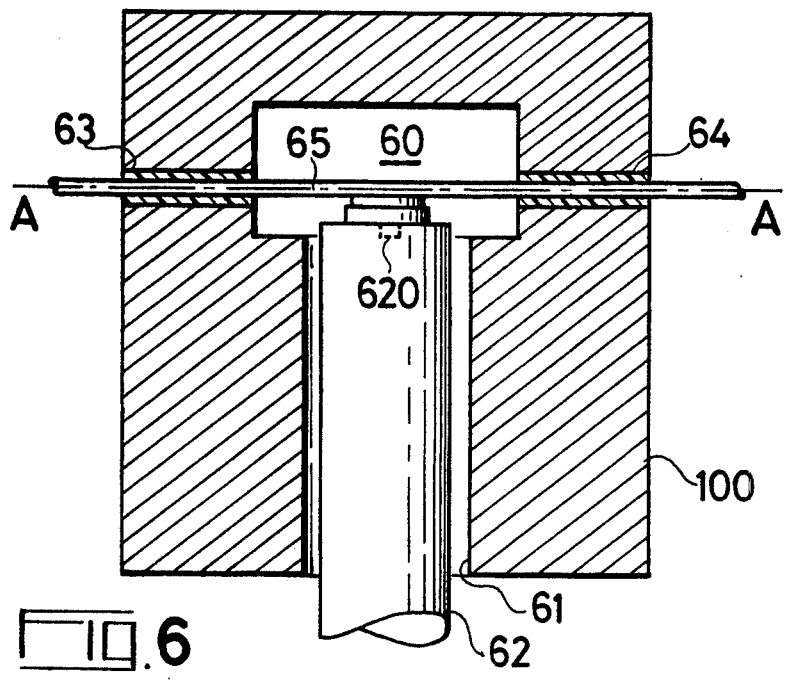

METHOD OF CREATING A MILLIMETER WAVE SOURCE AND OF ADAPTING SUCH A SOURCE TO WAVEGUIDE TRANSMISSION

The present invention relates to a method of creating a millimeter wave source and of adapting such a source for waveguide transmission.

A millimeter wave source is essentially constituted by a diode, for example an avalanche diode, capable of oscillation at a frequency equal to or exceeding 30 GHz.

If a diode without housing is used to form a source arranged for example in a waveguide, then several problems have to be dealt with:
- the diode has to be protected against shocks and humidity, for example by the provision of a sealed metal case and this gives rise to the possible drawback of disturbing resonance effects;
- the diode has to be biased, involving the connection of the appropriate electrode of the diode to a d.c. supply source, and this involves both delicate mechanical problems due to the small size of the diode and mechanical problems due to the small size of the diode and parasitic loop problems associated with the electromagnetic radiation;
- impedance matching has to be effected between the diode and the propagation medium and this for example requires the construction of a radial cavity filled with a suitable dielectric and surrounding the diode.

The invention facilitates the solution of these problems.

According to the invention, there is provided a method of manufacturing a millimeter wave source, said source being formed commencing from a semiconductor diode, comprising the following steps:

(a) the welding of a semiconductor chip, able of operating as an oscillator of the desired frequency, the chip for example being an avalanche diode, to the centre of a metal mounting presenting a projecting platform, the latter extending above a flat portion of said mounting by a height $h$;

(b) etching of said chip by chemical agents, the chip having previously been protected at its major faces respectively by said metal mounting and by a wax which is resistant to said chemical agents and is deposited upon the opposite face of said mounting;

(c) the positioning around said platform, of an impedance matching device constituted by a cylindrical frustum of a dielectric substance containing an axial hole sufficiently large to surround said projection, said hole ultimately being filled with a polymerisable resin which after polymerisation has a dielectric coefficient of the same order as said dielectric substance;

(d) the polymerisation of the resin followed by the grinding of said matching device in order to bare said semiconductor chip;

(e) the metallising of the part ground during the previous stage.

The invention will be better understood and other of its features rendered apparent from a consideration of the ensuing description and the accompanying drawings in which:

FIGS. 1 to 5 illustrate various stages of the method in accordance with the invention, applied to an example;

FIG. 6 illustrates an example of a device for adapting a source manufactured in accordance with the invention, to a waveguide.

Figure 1:
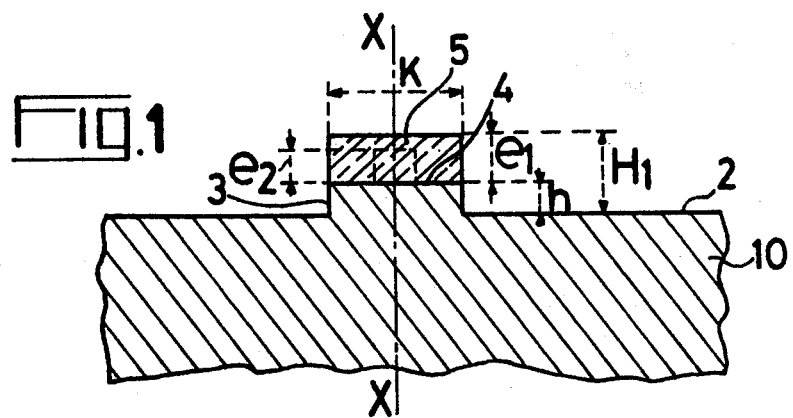

In the example described hereinafter, a first point of departure in the method is constituted by a dissipating mounting 10 of copper, shown in section in FIGS. 5 (fully) and 1 (partially). It comprises a body which is a cylinder of revolution about an axis XX. The top part of the body is a flat surface 2 comprising a central projection 3 terminated by a platform 4 extending above the plane 2 by a uniform height $h$. This projection is cylindrical and 200 microns in diameter for example.

A second point of departure is constituted by a semiconductor diode of avalanche type, manufactured for example from a monocrystalline silicon disc doped and epitaxially grown in accordance with the results which are to be obtained from the millimeter wave source. The disc has been cut into square chips having a diagonal length of the same order (200 microns) as the diameter K of the cylindrical projection 3. It is advantageous, in other words, to arrange that the dimensions of the chip and the platform to which it is to be welded by thermocompression, are similar to one another. Under the considerable effort (a pressure of 1500 kg/cm²) which is applied, the chip tends to either break or to be immersed into the copper and this is an effect which is avoided if the chip substanitally covers the whole of the platform.

The square shape of the chip and the cylindrical shape of the platform stem from the different technologies used to manufacture them. It is not considered worthwhile complicating these technologies simply in order to achieve perfect identity between the surfaces.

The thickness of the chip is $e_1$, for example of the order of 100 microns. It is dictated by the structure of the avalanche diode and by the frequency of oscillation required.

Dashed lines have been used to indicate the diode of thickness $e_2$ which is less than $e_1$, obtained at the end of the process.

At a later point the method by which the parameters $h$ and $H_1(h + e_1)$ are determined, will be explained.

Figure 2:
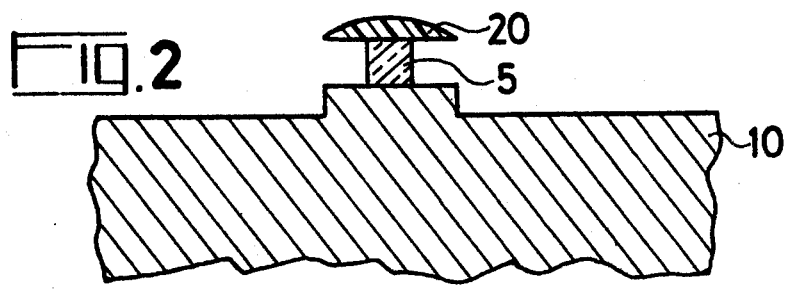

FIG. 2 illustrates the device obtained at the end of step (b), this being the step in which lateral chemical etching takes place. To this end, on the still intact chip 5 there has been deposited a drop of wax 20, for example a drop of PICEINE (registered trade mark). By the combined action of a mixture of hydrochloric acid and nitric acid (of the kind used for etching silicon) purely lateral erosion is brought about and this reduces the chip 5, giving it an approximately cylindrical shape without reducing its thickness. The "cap" of wax and the copper mounting, the latter possibly being nickel-plated and gold-plated, are not attacked by the aforementioned etching agent. The cap is eliminated by a solvent at the end of the stage.

Figure 3:
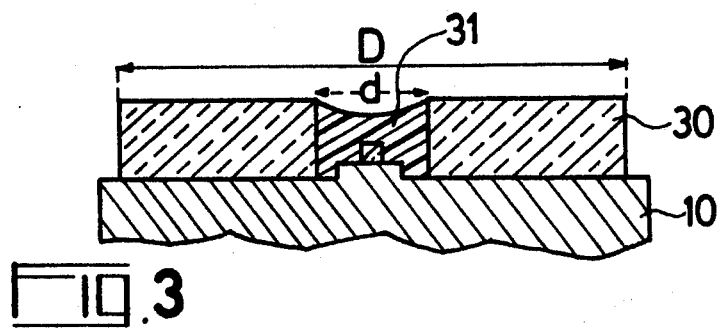

FIG. 3 illustrates a device obtained at the end of step (c) after the positioning of an impedance-matching device 30 of quartz glass type and a resin plug 31 in the central orifice of the matching device.

The matching device may be manufactured by sawing a quartz glass tube having an external diameter D of the order of half the wavelength in glass and an internal diameter $d$ of the order of 250 to 500 microns, into one millimeter long sections. The sections are then ground to a size slightly greater than the sum of the dimensions $h$ and $e_1$ ($H_1$ in FIG. 1).

Precautions must be taken to stick the matching device accurately to the mounting, in particular by the deposition of a drop of polyimide resin and heating to a temperature below the polymerisation temperature, before the glass section is fixed in place. The central opening in the section is then filled with this same polyimide resin.

Figure 4:
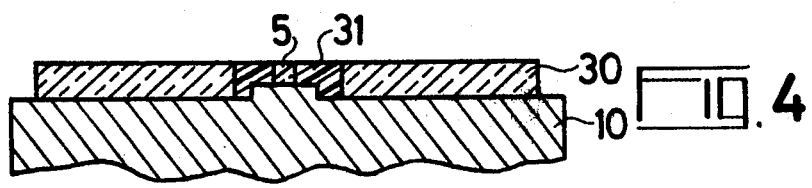

FIG. 4 illustrates the device obtained at the end of step (d), after the top part has been ground. The grinding is performed mechanically for example using a diamond abrasive paste and an aluminium grinding plate. Grinding is halted when the top face of the diode 5 has been completely bared. Optionally, selective chemical etching of the diode may then be carried out using a fluonitric mixture.

FIG. 5 illustrates the device obtained at the end of step (e) which involves the metallising of the top face ground during the course of the preceding step. The metallised layer 50 illustrated there is obtained for example by cathode-sputtering of titanium followed by vapourisation (under vacuum) of gold in order to produce a 1 to 2 micron thick layer which is subsequently consolidated by electrolysis in a bath of gold salts. The cavity 51 at the centre of the metallised area will be noted: this is due to the selective chemical etching of the diode (optional).

The dissipating mounting 10 has been shown in section in full, in FIG. 5, illustrating not only the cylindrical body 11 but also a possibly screwed spigot 12.

By way of example, a millimeter wave source having the following specification can be obtained in this way:
Diode: Final thickness: 50 microns;
Mounting:
  Approximate diameter: 50 microns;
  Diameter of the cylindrical body 11: 2.4 mm;
  Diameter of the central projection: 0.2 mm;
  Height of the central projection: 50 microns;
Impedance-matching device:
  Quartz glass type; (dielectric factor around 4);
  External diameter: 2 mm;
  internal diameter: 0.5 mm;
  Thickness: approximately 100 microns;
Frequency of oscillation: 45 GHz;
Power: around 50 mW.

Generally speaking, the dimensions D (external diameter) and H (dielectric thickness) of the impedancematching device (FIG. 5) are optimum for a given frequency and power. These dimensions can be determined by trial and error. The dimension H in fact determines the height $h$ of the central projection of the metal mounting 10 (FIG. 1), bearing in mind the technology described earlier.

In a method of adapting a millimeter wave source in accordance with the invention to a waveguide, one makes in a section of said waveguide:
  a first opening providing access to a positioning member to which said source is fixed in such a fashion that the metallised layer 50 advances frontally when said component is made to penetrate into said opening;
  a second opening giving access to a conductive connection protected along its crossing of the wall by an insulating sleeve;
  a third opening, identical to the second and arranged in such a fashion that the conductive connection between the second and third openings, is parallel to the metallised layer 50.

In the example shown in FIG. 6, a waveguide section 100, comprises walls which are thicker than the remainder of the waveguide, in particular at one of the larger sides of the cavity 60.

An opening 61 formed in the thickest wall, constitutes the first opening; it makes it possible for a cylindrical positioning member 62 (illustrated fragmentally) to slide there, the diameter of this member being modifiable by means of a clamping device which has not been shown. At the end of this member the source is fixed in position through the agency of a spigot on its mounting, which screws into a threaded hole 620.

The openings 63 and 64 are cylinders having a common axis AA in the same right section as the axis of the member 62 and perpendicular to the latter.

To facilitate assembly, the section 100 has previously been split into two parts at a plane passing through the axis AA and perpendicular to the plane of the figure. The cylinders 63 and 64 are then formed in halves successively and subsequently filled with polyimide resin. A conductor 65 having a diameter of the order of one tenth of a millimeter, extends between two resin-filled half-cylinders and is maintained in position whilst the two parts of a section are united and whilst polmerisation of the resin is carried out in a suitable oven.

Amongst the advantages of the invention, which have not yet been mentioned, the following can be pointed to:
  excellent protection of the diode of a kind similar to that which would be furnished by a case although without the drawbacks which the latter would involve;
  simplicity of the bias system shown in FIG. 6, making it possible to avoid the need to add any high frequency decoupling of the d.c. supply line due to the fact that the bias conductor is here perpendicular to the electric field in the waveguide.

What we claim is:
1. A method of manufacturing a millimeter wave source, said source being formed commencing from a semiconductor diode, comprising the following steps:
  (a) the welding of a semiconductor chip, able of operating as an oscillator of the desired frequency, the chip for example being an avalanche diode, to the centre of a metal mounting presenting a projecting platform, the latter extending above a flat portion of said mounting by a height $h$;
  (b) etching of said chip by chemical agents, the chip having preiously been protected at its major faces respectively by said metal mounting and by a wax which is resistant to said chemical agents and is deposited upon the opposite face of said mounting;
  (c) the positioning around said platform, of an impedancematching device constituted by a cylindrical frustum of a dielectric substance containing an axial hole sufficiently large to surround said projection, said hole ultimately being filled with a polymerisable resin which after polymerisation has a dielectric coefficient of the same order as said dielectric substance;
  (d) the polymerisation of the resin followed by the grinding of said matching device in order to bare said semiconductor chip;
  (e) the metallising of the part ground during the previous stage.

2. A method as claimed in claim 1, comprising an additional step arranged between those (d) and (e), which consists in selectively etching the semiconductor chip bared during the course of step (d), by means of chemical agents.

3. A method as claimed in claim 1, wherein the height $h$ of said platform is designed in order, at step (e), to achieve a predetermined thickness on the part of the dielectric.

4. A method as claimed in claim 1, wherein said semiconductor chip is an avalanche diode, the impedance-matching device is made of glass and obtained by cutting a glass tube of small internal diameter, and the polymerisable resin is of polyimide type.

5. A millimeter wave source manufactured by a method as claimed in claim 1.

* * * * *